(12) United States Patent
Rhodes et al.

(10) Patent No.: US 9,419,171 B2
(45) Date of Patent: Aug. 16, 2016

(54) TWO-PART SCREEN PRINTING FOR SOLAR COLLECTION GRID

(71) Applicant: Hanergy Hi-Tech Power (HK) Limited

(72) Inventors: Zulima Rhodes, Tucson, AZ (US); Darren Verebelyi, Tucson, AZ (US)

(73) Assignee: Hanergy Hi-Tech Power (HK) Limited, West KL (HK)

( * ) Notice: Subject to any disclaimer, the term of this patent is extended or adjusted under 35 U.S.C. 154(b) by 0 days.

(21) Appl. No.: 14/708,118

(22) Filed: May 8, 2015

(65) Prior Publication Data

US 2015/0243832 A1  Aug. 27, 2015

Related U.S. Application Data

(63) Continuation of application No. 13/278,584, filed on Oct. 21, 2011, now Pat. No. 9,029,181.

(60) Provisional application No. 61/405,599, filed on Oct. 21, 2010.

(51) Int. Cl.
| | |
|---|---|
| *H01L 21/00* | (2006.01) |
| *H01L 29/18* | (2006.01) |
| *H01L 31/18* | (2006.01) |
| *H01L 31/0224* | (2006.01) |
| *H01L 31/05* | (2014.01) |

(52) U.S. Cl.
CPC .... *H01L 31/1876* (2013.01); *H01L 31/022425* (2013.01); *H01L 31/0512* (2013.01); *H01L 31/1884* (2013.01); *Y02E 10/50* (2013.01)

(58) Field of Classification Search
CPC ..... H01L 25/00; H01L 25/045; H01L 25/047; H01L 27/1421; H01L 27/1422; H01L 27/1426; H01L 27/3227; H01L 31/02008; H01L 31/02021; H01L 31/02167; H01L 31/0725
USPC ........................................ 438/64, 59, 22, 152
See application file for complete search history.

(56) References Cited

U.S. PATENT DOCUMENTS

| | | | |
|---|---|---|---|
| 7,635,810 B2 | 12/2009 | Luch | |
| 8,076,568 B2 | 12/2011 | Luch et al. | |
| 8,110,737 B2 | 2/2012 | Luch | |
| 8,138,413 B2 | 3/2012 | Luch et al. | |
| 8,222,513 B2 | 7/2012 | Luch | |
| 8,664,030 B2 | 3/2014 | Luch et al. | |
| 8,729,385 B2 | 5/2014 | Luch | |
| 2003/0005955 A1* | 1/2003 | Shiotsuka | H01L 31/02008 136/251 |
| 2003/0087079 A1* | 5/2003 | Okabe | B32B 5/18 428/304.4 |
| 2004/0046154 A1* | 3/2004 | McVicker | C03C 3/072 252/512 |

(Continued)

OTHER PUBLICATIONS

May 14, 2013, Office action from the U.S. Patent and Trademark Office, in U.S. Appl. No. 13/278,584, which shares the same priority as this U.S. application.

(Continued)

*Primary Examiner* — Selim Ahmed
*Assistant Examiner* — Moin Rahman
(74) *Attorney, Agent, or Firm* — Kolisch Hartwell, P.C.

(57) ABSTRACT

Methods and apparatus relating to providing a collection grid suitable for use in PV modules. The disclosed collection grid may be at least partially applied to a protective laminate sheet in a manner that removes the high temperature requirements of conventional screen printed collection grids, to avoid unwanted heat-related deformation of the laminate sheet.

20 Claims, 5 Drawing Sheets

(56) References Cited

U.S. PATENT DOCUMENTS

| | | | |
|---|---|---|---|
| 2005/0045379 A1 | 3/2005 | Sakurai et al. | |
| 2008/0000519 A1* | 1/2008 | Takahashi | H01L 31/02242 136/252 |
| 2009/0101206 A1* | 4/2009 | Diklich | H01L 51/441 136/257 |
| 2009/0255565 A1 | 10/2009 | Britt et al. | |
| 2010/0240166 A1* | 9/2010 | Ishii | H01L 31/188 438/61 |
| 2010/0313946 A1* | 12/2010 | Higuchi | H01L 31/048 136/256 |
| 2011/0212306 A1* | 9/2011 | Whitlock | B29C 66/301 428/174 |
| 2012/0171802 A1 | 7/2012 | Luch et al. | |
| 2013/0240011 A1 | 9/2013 | Luch | |
| 2013/0312809 A1 | 11/2013 | Luch et al. | |
| 2014/0102502 A1 | 4/2014 | Luch et al. | |

OTHER PUBLICATIONS

Feb. 20, 2014, Office action from the U.S. Patent and Trademark Office, in U.S. Appl. No. 13/278,584, which shares the same priority as this U.S. application.

Nov. 6, 2014, Office action from the U.S. Patent and Trademark Office, in U.S. Appl. No. 13/278,584, which shares the same priority as this U.S. application.

* cited by examiner

TWO-PART SCREEN PRINTING FOR SOLAR COLLECTION GRID

CROSS-REFERENCE TO RELATED APPLICATIONS

This application is a continuation of U.S. patent application Ser. No. 13/278,584, filed Oct. 21, 2011, which claims priority from U.S. Provisional Patent Application Ser. No. 61/405,599, filed Oct. 21, 2010, each of which is incorporated herein by reference. This application also incorporates by reference in their entireties the following U.S. patent and patent applications: U.S. Pat. No. 7,194,197, issued Mar. 20, 2007; Ser. No. 12/364,440, filed Feb. 2, 2009; Ser. No. 12/587,111, filed Sep. 30, 2009; Ser. No. 12/424,497, filed Apr. 15, 2009; Ser. No. 12/397,846, filed Mar. 4, 2009; Ser. No. 12/397,863, filed Mar. 4, 2009; Ser. No. 12/397,873, filed Mar. 4, 2009; and Ser. No. 12/397,899, filed Mar. 4, 2009.

BACKGROUND

The field of photovoltaics generally relates to multi-layer materials that convert sunlight directly into DC electrical power. The basic mechanism for this conversion is the photovoltaic effect, first observed by Antoine-Cesar Becquerel in 1839, and first correctly described by Einstein in a seminal 1905 scientific paper for which he was awarded a Nobel Prize for physics. In the United States, photovoltaic (PV) devices are popularly known as solar cells or PV cells. Solar cells are typically configured as a cooperating sandwich of p-type and n-type semiconductors, in which the n-type semiconductor material (on one "side" of the sandwich) exhibits an excess of electrons, and the p-type semiconductor material (on the other "side" of the sandwich) exhibits an excess of holes, each of which signifies the absence of an electron. Near the p-n junction between the two materials, valence electrons from the n-type layer move into neighboring holes in the p-type layer, creating a small electrical imbalance inside the solar cell. This results in an electric field in the vicinity of the metallurgical junction that forms the electronic p-n junction.

When an incident photon excites an electron in the cell into the conduction band, the excited electron becomes unbound from the atoms of the semiconductor, creating a free electron/hole pair. Because, as described above, the p-n junction creates an electric field in the vicinity of the junction, electron/hole pairs created in this manner near the junction tend to separate and move away from junction, with the electron moving toward the electrode on the n-type side, and the hole moving toward the electrode on the p-type side of the junction. This creates an overall charge imbalance in the cell, so that if an external conductive path is provided between the two sides of the cell, electrons will move from the n-type side back to the p-type side along the external path, creating an electric current. In practice, electrons may be collected from at or near the surface of the n-type side by a conducting grid that covers a portion of the surface, while still allowing sufficient access into the cell by incident photons.

Such a photovoltaic structure, when appropriately located electrical contacts are included and the cell (or a series of cells) is incorporated into a closed electrical circuit, forms a working PV device. As a standalone device, a single conventional solar cell is not sufficient to power most applications. As a result, solar cells are commonly arranged into PV modules, or "strings," by connecting the front of one cell to the back of another, thereby adding the voltages of the individual cells together in electrical series. Typically, a significant number of cells are connected in series to achieve a usable voltage.

The resulting DC current then may be fed through an inverter, where it is transformed into AC current at an appropriate frequency, which is chosen to match the frequency of AC current supplied by a conventional power grid. In the United States, this frequency is 60 Hertz (Hz), and most other countries provide AC power at either 50 Hz or 60 Hz.

One particular type of solar cell that has been developed for commercial use is a "thin-film" PV cell. In comparison to other types of PV cells, such as crystalline silicon PV cells, thin-film PV cells require less light-absorbing semiconductor material to create a working cell, and thus can reduce processing costs. Thin-film based PV cells also offer reduced cost by employing previously developed deposition techniques for the electrode layers, where similar materials are widely used in the thin-film industries for protective, decorative, and functional coatings. Common examples of low cost commercial thin-film products include water impermeable coatings on polymer-based food packaging, decorative coatings on architectural glass, low emissivity thermal control coatings on residential and commercial glass, and scratch and anti-reflective coatings on eyewear. Adopting or modifying techniques that have been developed in these other fields has allowed a reduction in development costs for PV cell thin-film deposition techniques.

Furthermore, thin-film cells have exhibited efficiencies approaching 20%, which rivals or exceeds the efficiencies of the most efficient crystalline cells. In particular, the semiconductor material copper indium gallium diselenide (CIGS) is stable, has low toxicity, and is truly a thin film, requiring a thickness of less than two microns in a working PV cell. As a result, to date CIGS appears to have demonstrated the greatest potential for high performance, low cost thin-film PV products, and thus for penetrating bulk power generation markets. Other semiconductor variants for thin-film PV technology include copper indium diselenide, copper indium disulfide, copper indium aluminum diselenide, and cadmium telluride.

Some thin-film PV materials may be deposited either on rigid glass substrates, or on flexible substrates. Glass substrates are relatively inexpensive, generally have a coefficient of thermal expansion that is a relatively close match with the CIGS or other absorber layers, and allow for the use of vacuum deposition systems. However, when comparing technology options applicable during the deposition process, rigid substrates suffer from various shortcomings during processing, such as a need for substantial floor space for processing equipment and material storage, expensive and specialized equipment for heating glass uniformly to elevated temperatures at or near the glass annealing temperature, a high potential for substrate fracture with resultant yield loss, and higher heat capacity with resultant higher electricity cost for heating the glass. Furthermore, rigid substrates require increased shipping costs due to the weight and fragile nature of the glass. As a result, the use of glass substrates for the deposition of thin films may not be the best choice for low-cost, large-volume, high-yield, commercial manufacturing of multi-layer functional thin-film materials such as photovoltaics.

In contrast, roll-to-roll processing of thin flexible substrates allows for the use of compact, less expensive vacuum systems, and of non-specialized equipment that already has been developed for other thin film industries. PV cells based on thin flexible substrate materials also exhibit a relatively high tolerance to rapid heating and cooling and to large thermal gradients (resulting in a low likelihood of fracture or failure during processing), require comparatively low shipping costs, and exhibit a greater ease of installation than cells based on rigid substrates. Additional details relating to the composition and manufacture of thin film PV cells of a type suitable for use with the presently disclosed methods and apparatus may be found, for example, in U.S. Pat. Nos. 6,310,281, 6,372,538, and 7,194,197, all to Wendt et al. These patents are hereby incorporated into the present disclosure by reference for all purposes.

As noted previously, a significant number of PV cells often are connected in series to achieve a usable voltage, and thus a desired power output. Such a configuration is often called a "string" of PV cells, and can be formed, for example, using conductive tabs or ribbons, where a given tab electrically connects one polarity of a first cell to the opposite polarity of an adjacent cell. Alternatively, cells may be interconnected to form strings by monolithic integration techniques, i.e., by creating the electrical connections between cells in situ on the continuous substrate. Further details about forming modules of photovoltaic cells can be found in U.S. Patent Application Publication No. 2009-0255565-A1 (corresponding to application Ser. No. 12/364,440 filed Feb. 2, 2009), which is hereby incorporated by reference into the present disclosure.

Due to their delicate nature, unprotected flexible thin film solar cells and strings are susceptible to various forms of damage, ranging from mechanical handling to debris inclusions. Thus, it is beneficial to provide protection from these hazards following the last material deposition step. Ideally, a protective layer such as an adhesive film may be incorporated into the cell or string and provide protection throughout the product lifespan. However, thin film cells are often susceptible to heat damage at temperatures approaching setting conditions of many lamination materials, so that laminating an adhesive film onto a thin film cell may cause undesirable damage to the underlying cell. Similarly, thin film cells may experience heat damage at the setting temperatures of inks that are commonly used to print a collection grid onto a cell.

Yet another problem for thin film PV cells is a phenomenon known as "light soaking," whereby hot/dark environments such as those used in gridline ink and interconnect epoxy curing may cause the cell to go into a hibernation state. The cell then must be exposed to specific doses of irradiation to recover, adding complications to testing and binning steps. Furthermore, matching thermal expansion coefficients while selecting inexpensive and chemically compatible materials for use in fabrication stringing steps, such as epoxies, ribbons, dielectrics and the like, may be challenging. Thus, a method whereby the number of interconnecting materials deposited following collection grid deposition is significantly reduced or eliminated, where the cell material would experience fewer, shorter, or lower intensity thermal exposures, and/or where the cells or strings could be encapsulated following the last material deposition step, would be a significant advance in the art.

SUMMARY

The present teachings disclose methods and apparatus relating to providing a collection grid suitable for use in PV modules, in a manner that removes the high temperature requirements of conventional screen printed collection grids and that thereby protects the cells or strings from mechanical damage prior to module lamination. According to the present teachings, a collection grid and/or a cell interconnecting system can be screen printed or otherwise disposed on the inner (PV-facing) side of a front and/or back lamination sheet, so that the grid or interconnection system becomes electrically connected to the underlying PV cells during subsequent lamination of the sheet onto the cell.

DETAILED DESCRIPTION

Figure 1:
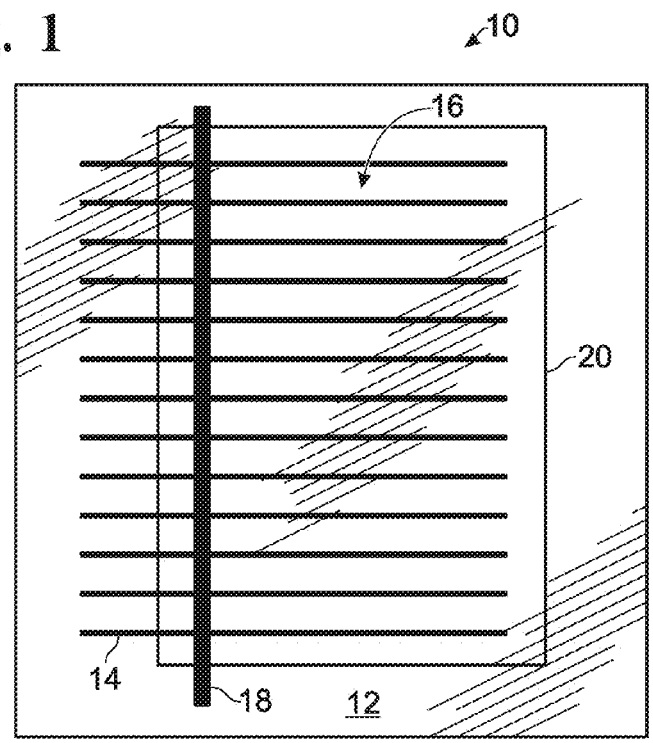
FIG. 1 is a schematic top view showing a laminate adhesive screen printed with a silver thermoset ink in a collection grid pattern and laminated to an unprinted photovoltaic cell, according to aspects of the present disclosure.

The present disclosure generally relates to the patterning of conductive collection grids on PV cells or PV modules in a manner that removes the high temperature requirements typical of conventional screen printing methods. To accomplish this, a portion or the entirety of a conductive grid may be initially deposited onto a laminate sheet or film (rather than directly onto the PV material itself), dried or otherwise cured at conditions or through methods where the laminate sheet is exposed to relatively low or localized temperature gradients to avoid deformation of the laminate web, and then applied to the underlying PV cell or cells. A subsequent lamination step bonds the laminate sheet and conductive grid more securely to the PV material, and in some embodiments may provide additional curing for the conductive grid.

In practice, flexible modules of interconnected solar cells are protected from environmental elements while retaining their flexibility by lamination between a flexible transparent protective top layer(s) or a "front sheet" and flexible protective bottom layer(s) or a "back sheet." However, conventional screen printable collection grids typically require sustained temperatures at or near typical lamination temperatures in order to properly set, so that a laminate sheet may not maintain its shape and desirable protective properties if screen printed with a collection grid in a conventional manner. Conversely, decreasing the temperature or time at temperature of the screen printing process may lead to poor electrical collection and other undesirable effects on the grid.

Accordingly, the present teachings provide various improved techniques that allow effective application of at least a portion of a PV collection grid directly to a laminate sheet, prior to lamination with other portions of a PV cell or module. In some cases, the applied grid may be dried at low temperature as a first curing step. In other cases, the applied grid may be "set," a generic term encompassing the final state of the conductive ink resin dried—in the case of a thermoplastic—or cured as a thermoset resin, with radiation, such as high frequency radiation. In still other cases, the applied grid may be set in a multi-phase process including various combinations of low temperature drying, radiation, and/or high temperature exposure during the lamination process.

In a first class of embodiments according to aspects of the present disclosure, a multi-phase settable metal-filled polymeric adhesive (which also may be referred to as a conductive ink) may be used as the conductive collection grid material and applied directly to a protective laminate sheet. This allows the collection grid traces to be imaged onto the laminate sheet in an initial step and set later in a lamination step and/or additional curing steps. In these embodiments, contact to the underlying PV material is improved from "static traces" during one or more curing or drying phases, where limited long range polymeric chain movements can occur. This allows the conductive ink material to conform to the substrate, thereby increasing total contact area at the PV/trace interface.

More specifically, a multi-phase conductive ink may be screen printed, micro-pipetted, flexographed, or otherwise applied onto a laminate adhesive film and then dried at low temperature and for a nominal time to allow for removal of volatiles from the conductive ink. During this time, the laminate adhesive film is not significantly deformed or detrimentally impacted by the exposure temperature. The film can be cooled and wrapped in a reel to reel fashion, with or without interleaf, and routed to downstream processes. The printed film is eventually laminated onto the PV material. During lamination, the conductive ink material cross links or entangles, internally pressing the metal flakes into contact with the PV material, thereby achieving the final conductivity while achieving satisfactory contact to the PV surface. Although a two-phase ink is suitable for many applications, the present teachings contemplate multi-phase setting that may include more than two phases.

For example, FIG. 1 shows an exemplary screen printed laminate adhesive, generally indicated at 10, according to the first class of embodiments described above. Screen printed laminate adhesive 10 includes a substantially transparent laminate adhesive film or sheet 12, which has been screen printed (on its underside, as shown in FIG. 1) with silver one-part thermoplastic ink 14 to form a grid pattern, generally indicated at 16. Grid pattern 16 may include a bus bar 18 or the like, to consolidate electrical current from multiple grid lines. Screen printed laminate adhesive 10 has been dried at low temperature, aligned with a PV cell 20 (disposed under sheet 12 in FIG. 1), and then laminated to the cell.

Various materials may be suitable for forming adhesive laminate sheet 12, including without limitation ethylene vinyl acetate (EVA), ethylene copolymers, various ionomers, thermoplastic urethanes, silicones, polychlortrifluorethylene, fluorothermoplastics, and polyolefin copolymers. Because it will be disposed above the active photovoltaic surface of a solar cell or module, the laminate sheet will generally be substantially transparent to solar radiation in a desired wavelength range. Aside from the grid pattern formed by thermoplastic ink 14, additional metallic or conductive solids may be printed on laminate film 12 or applied as a tape, film, ribbon or otherwise, to improve the conductivity of the finished PV module, particularly in the vicinity of the module buss bars and inter-cell connections. For example, a metallic ribbon may be placed between the printed collection grid and the PV cell, and adhered with conductive adhesive.

Figure 2:
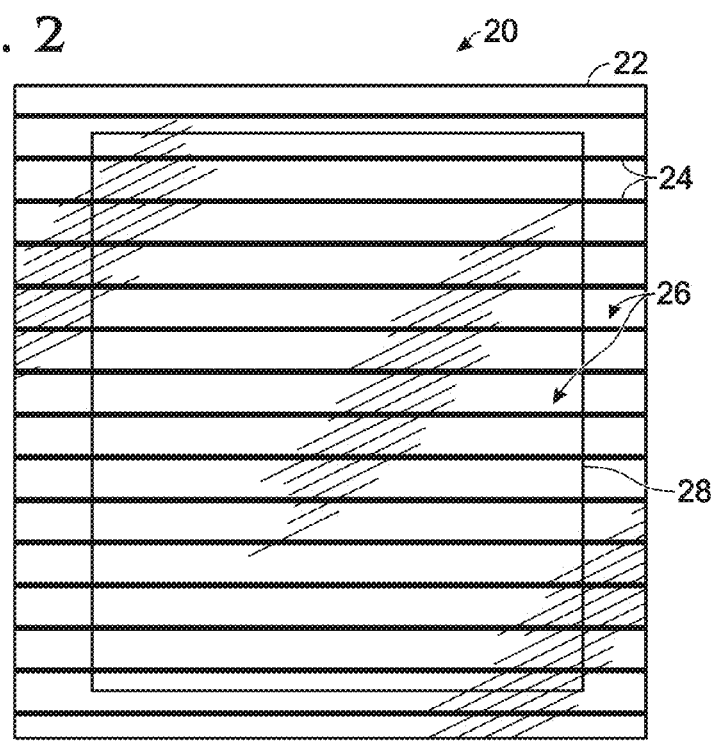
FIG. 2 is a schematic top view showing a laminate adhesive ink jet printed with silver nanoparticle ink in a collection grid pattern and laminated to an unprinted photovoltaic cell, according to aspects of the present disclosure.

FIG. 2 is generally similar to FIG. 1, except that the material used for the conductive grid is a silver nanoparticle ink and is applied to the laminate sheet by ink jet printing rather than screen printing. More specifically, FIG. 2 shows a screen printed laminate adhesive, generally indicated at 20, which includes a laminate adhesive sheet 22 ink jet printed with silver nanoparticle ink 24 to form a grid pattern (disposed on the bottom side of sheet 22 in FIG. 2), generally indicated at 26. After being ink jet printed onto laminate adhesive sheet 22, silver nanoparticle ink 24 may be set by any suitable method, such as those described above. Ink jet printed laminate adhesive 20 has been subsequently aligned with an unprinted PV cell 28 and then laminated to the cell. In FIG. 2, cell 28 is disposed under sheet 22, so that grid pattern 26 is in physical contact with the top side (i.e., the light gathering side) of the cell.

In another class of embodiments according to the present teachings, a formula of conductive ink with a glass transition temperature below operating conditions may be applied to a laminate sheet in a grid pattern, dried at a relatively low temperature, below 130 degrees Celsius but preferably between 75 and 95 degrees Celsius to avoid deformation of the laminate sheet, and then press-fit to one or more underlying PV cells. For example, a specially formulated no or low volatility one-part or two-part silver flake epoxy-based paste may be used as a suitable conductive paste, and may require a maximum initial curing temperature of only approximately 80 degrees Celsius or less for a relatively short time, such as 2-4 minutes. The grid then may be additionally shaped to the underlying PV cell(s) through additional thermal exposure, such as during a subsequent lamination process.

In yet another class of embodiments according to the present teachings, a conductive collection grid may be printed onto a protective laminate sheet via ink jet printing or some other suitable method, set by radiation, and then aligned with or without press fitting to PV cells or modules. For instance, combinations or substitutions of thermal, UV, and higher frequency radiation curing methods may be employed in combination with modified grid material chemistries, including thermoplastic screen printable inks and thermosetting screen printable inks, to allow low temperature curing.

When press fitting is used to facilitate bonding between a collection grid disposed on a laminate adhesive sheet and PV material, various measures can be taken to mitigate possible contact resistance resulting from the press fitting. For example, as described previously, the conductive grid material may be a conductive paste having a low glass transition temperature, which conforms to the PV cell during lamination. In addition, chemical or physical surface modification of either the ink or the PV substrate may be employed. More specifically, the conductive grid may include two or more different layered elements, or modified layers of a single element, so that the portion of the grid making contact with the PV surface forms a lower resistance electrical connection with the PV material.

Examples of suitable layering or modification steps include printing additional particles of the original grid material onto the conductive grid after initial setting, printing additional particles of a different conductive grid material (such as an alloy, oxide or nitride) onto the conductive grid either before or after initial setting, dispensing a solvent onto the top surface of the grid before setting to expose bare metal flakes or particles, and/or printing a higher solids content (i.e., metal content) grid material onto the initially applied grid before or after setting. Regardless of its composition, an additionally applied grid material layer may be set at the same time as the initial grid layer, after setting the initial grid layer but prior to lamination of the laminate adhesive sheet to the PV cell, or during lamination.

In yet another class of embodiments according to aspects of the present disclosure, a conductive grid may be partially printed onto an adhesive laminate sheet as described above, and also partially printed directly onto PV material, to achieve a desired level of grid conductivity when the laminate sheet and the PV material are laminated together. For example, intra-cell conductors may be deposited directly onto PV material, and inter-cell conduction pathways (such as buss bars) may be deposited onto a laminate sheet using the materials and techniques described previously. A fully connected conductive grid then may be formed when the laminate film and the PV material are brought together through press fitting and/or lamination. If suitable insulating materials are used, this hybrid technique may be used to insulate the PV material from the relatively high current densities of the inter-cell connections (i.e., the buss bars).

Figure 3:
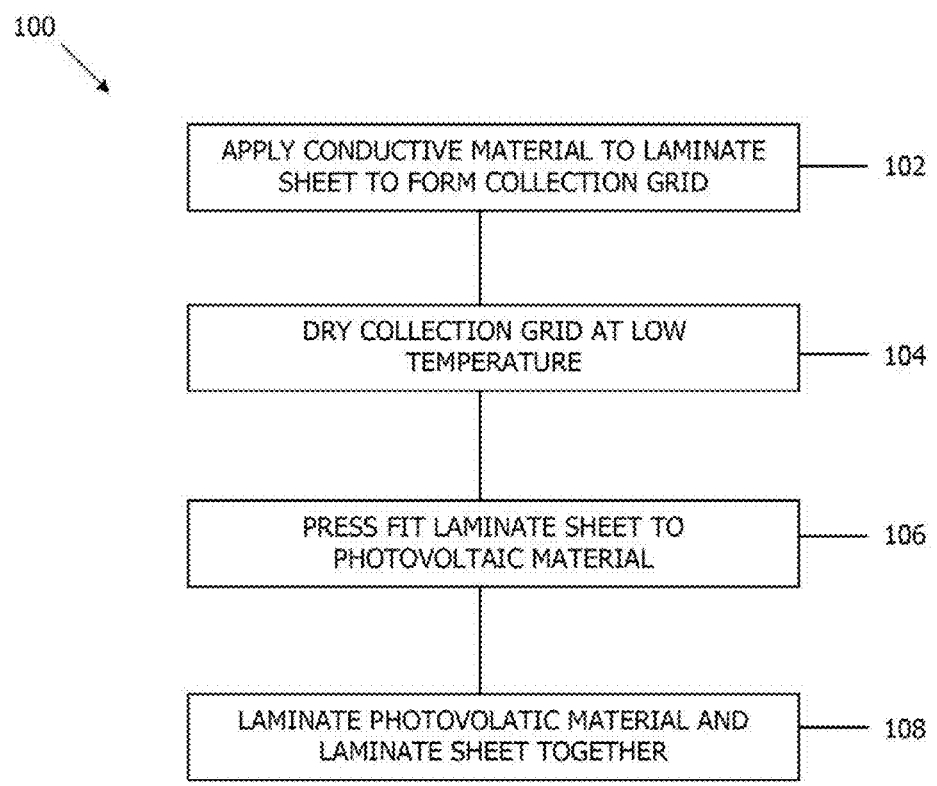
FIG. 3 is a flowchart depicting a first method of providing a collection grid to a PV cell, according to aspects of the present disclosure.

FIG. 3 is a flowchart depicting a method, generally indicated at 100, of providing a conductive collection grid to a PV cell according to selected embodiments described above. At step 102, a conductive material is applied to a substantially transparent laminate sheet in at least a partial collection grid pattern. Conductive grid materials, laminate sheet materials, and methods of applying the conductive grid to the laminate sheet (including the possibility of multiple grid layers and/or modified grid layers) have been described previously. At step 104, the collection grid is dried at a temperature sufficiently low to avoid substantial deformation of the laminate sheet. At step 106, the laminate sheet is press fit to PV material so that the collection grid makes electrical contact with the PV surface. At step 108, the PV material and the laminate sheet are laminated together.

Figure 4:
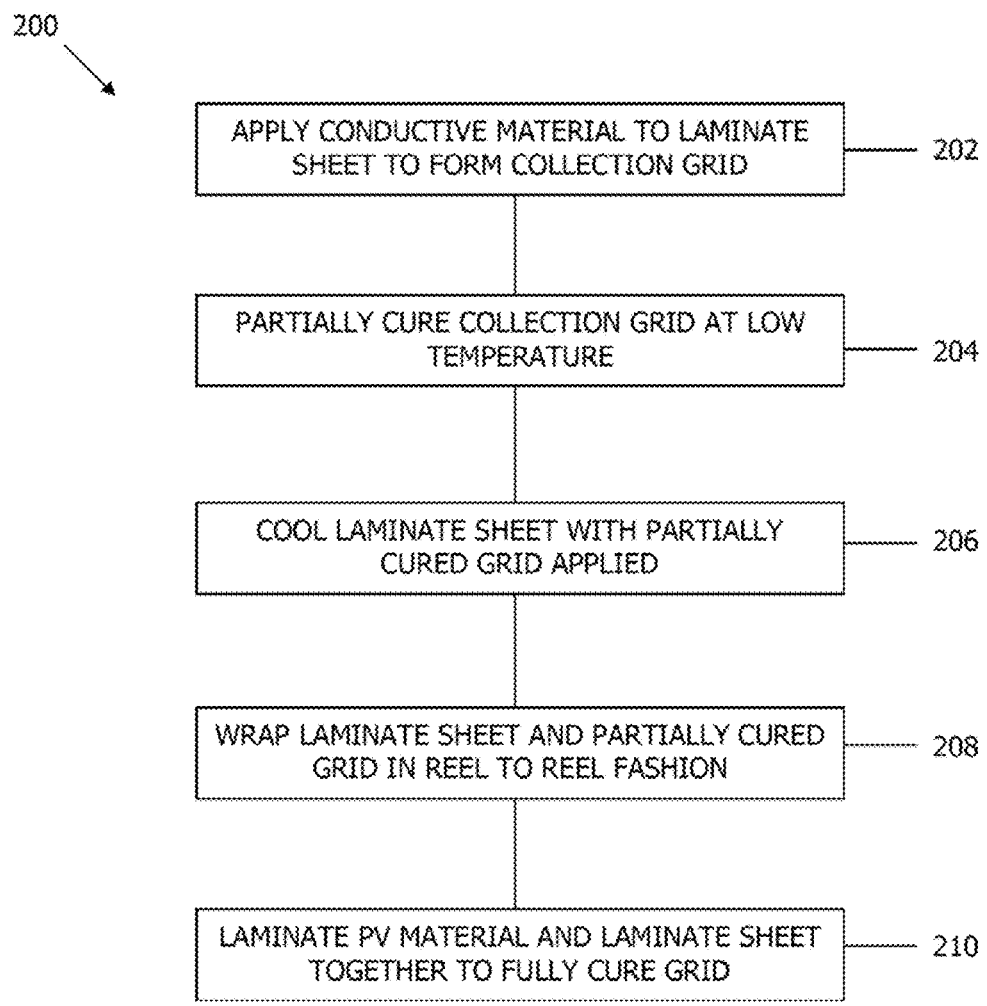
FIG. 4 is a flowchart depicting another method of providing a collection grid to a PV cell, according to aspects of the present disclosure.

FIG. 4 is a flowchart depicting a method, generally indicated at 200, of providing a conductive collection grid to PV material utilizing a two-phase curable grid material. At step 202, a two-phase curable, conductive material such as a conductive polymeric adhesive is applied by any suitable application technique to a laminate sheet, to form at least a portion of a conductive collection grid. At step 204, a first curing step is performed at a temperature sufficiently low to avoid significant deformation of the laminate sheet. The first processing step sets the grid sufficiently to allow bending and other manipulation of the laminate sheet without compromising the integrity of the applied grid.

At steps 206 and 208, respectively, the laminate sheet (with a partially set grid) is optionally cooled and then optionally wrapped in reel to reel fashion. Reel to reel wrapping may be performed at step 208 at relatively high tension, which is believed to scrape the surface of the partially set conductive grid and eventually to result in improved electrical contact between the grid and the PV material. At step 210, the laminate sheet is laminated onto PV material. The lamination step serves as a second curing step, during which the grid material may cross link, entangle, or otherwise cause the conductive elements of the grid material to form more continuous pathways for the passage of electrical current from the PV material through the grid.

Figure 5:
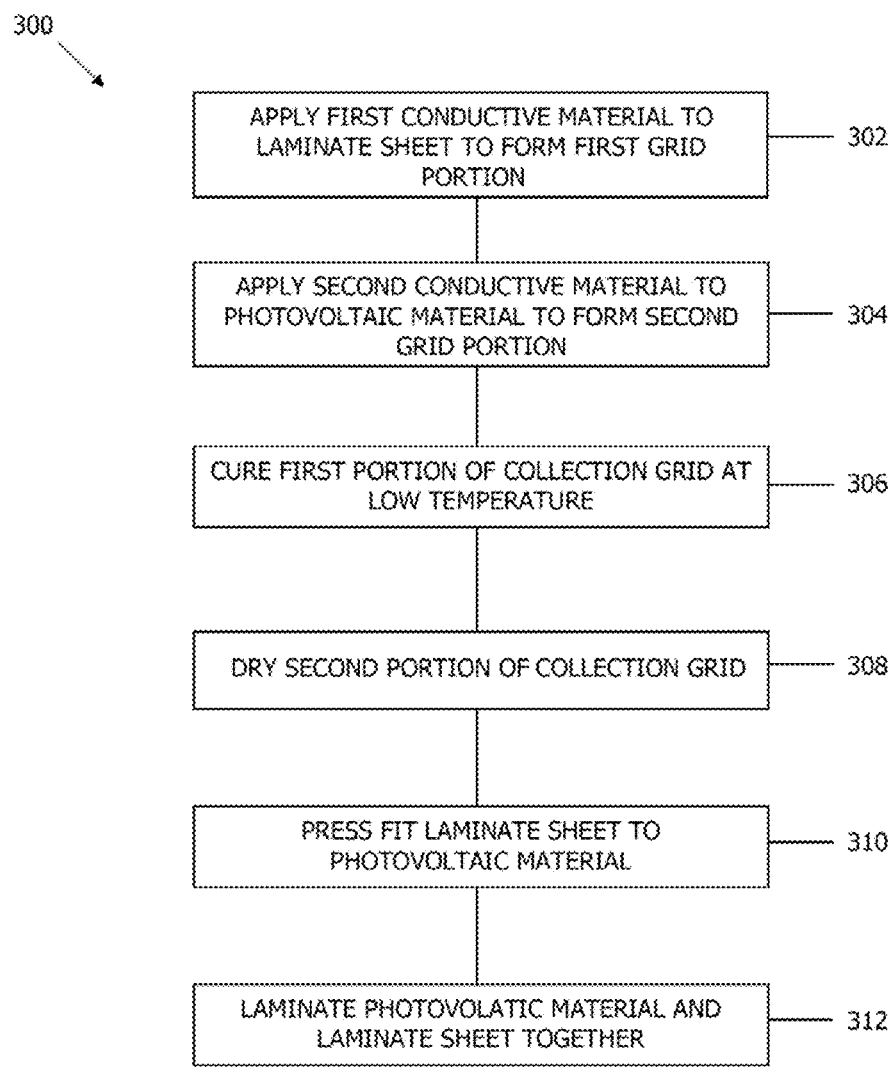
FIG. 5 is a flowchart depicting yet another method of providing a collection grid to a PV cell, according to aspects of the present disclosure.

FIG. 5 is a flowchart depicting a method, generally indicated at 300, of providing a conductive collection grid to a PV cell or module by providing portions of the grid to each of a laminate sheet and PV material, and then laminating the sheet to the PV material. At step 302, a first conductive grid material is applied to a laminate sheet, to form a first portion of a conductive collection grid. At step 304, a second conductive grid material is applied to PV material, to form a second portion of a conductive collection grid complementary to the first portion.

In some cases, the first and second conductive grid materials may be identical, whereas in other cases the grid materials may be different, for example to promote better adhesion to the different surfaces of the laminate sheet and the PV material. Furthermore, the methods used to apply the conductive grid portions may or may not be the same. For example, in some cases, screen printing or ink jet printing may be used to apply both grid portions, whereas in other cases, printing may be used to apply grid material to the laminate sheet, and some other technique such as vapor deposition or sputtering may be used to apply grid material to the PV material.

At step 306, a first curing step is performed to at least partially cure or dry the grid material on the laminate sheet, at a temperature sufficiently low to avoid significant deformation of the laminate sheet. Depending on the material chosen for the grid material applied to the laminate, the first drying step may or may not set the grid portion applied to the laminate sheet substantially entirely. This depends, for example, on whether the selected grid material is one-phase settable or two-phase settable. In some cases, the grid portion applied to the PV material may be initially dried in a separate step 308. Initial drying step 308 of the grid portion applied to the PV material may occur in conjunction with initial curing of the grid material applied to the laminate sheet, or it may occur at a different time, location and/or temperature from step 306. Depending on the material and method of application of the grid portion to the PV material, initial drying step 308 may not be required at all.

At step 310, the laminate sheet and the PV material are optionally press fit together, and at step 312, the laminate sheet and the PV material are laminated together. These steps (or just the step of lamination, if press fitting is not performed) result in electrical contact being formed between the previously separated grid portions, to form an electrically connected collection grid. As described previously, whether a press fitting step is performed depends on factors such as whether subsequent lamination step 312 is expected to provide sufficient electrical conductivity between the connected grid and the underlying PV material.

Figure 6:
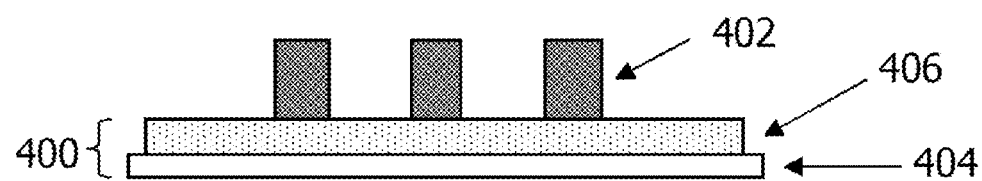
FIG. 6 is a schematic cross-sectional view of a collection grid printed on a multi-layer laminate composite, according to aspects of the present disclosure.

FIG. 6 is a schematic cross-sectional view of a collection grid printed on a multi-layer laminate composite, according to aspects of the present disclosure. More specifically, FIG. 6 depicts a multi-layer laminate film or composite 400, which has been screen printed with silver one-part thermoplastic ink 402 to form a grid pattern. Laminate composite 400 may be a stack of several films of various compositions as required to facilitate roll-to-roll processing or automated sheet fed processing. For example, a glassy rigid transparent polymer such as polyethylene terephthalate (PET) may be used as a carrier sheet 404 to allow an adhesive material 406 such as ethylene vinyl acetate (EVA) to be processed under conditions of moderate tensile stress at temperatures approaching the softening point of the adhesive without deformation of the substrate.

Preferably, rigid polymer carrier sheet 404 is formulated appropriately to withstand module weathering, and is included in a finished module product. Alternatively, rigid polymer carrier sheet 404 may be discarded in a later processing step. Various materials may be suitable for forming adhesive laminate sheet 406, including without limitation EVA, ethylene copolymers, various ionomers, thermoplastic urethanes, silicones, polychlortrifluorethylene, fluorothermoplastics, dry films formed from aliphatic urethane acrylates, hydrophobic aliphatic acrylates, multifunctional (meth) acrylates, monofunctional (meth)acrylates, and polyolefin copolymers.

Materials suitable for rigid carrier sheet 404 include without limitation polyether ether ketone (PEEK), polyvinyl butyral (PVB), polyethylene terephthalate (PET), polyethylene naphthalate (PEN), polycarbonates, polypropylenes, polysulfones, polyether sulfones, polyvinyl chloride (PVC), polyvinylidene difluoride, cyclic olefin polymers and various multilayer polymer/glass composites. As in the case of a single-layer laminate sheet, a multi-layer laminate sheet disposed above the active photovoltaic surface of a PV cell or module will generally be transparent to solar radiation in a desired wavelength range.

Various possible combinations and modifications of the methods and apparatus described above are possible and should be apparent. For instance, any of the previous teachings may be applied to a backside laminate sheet alternatively or in addition to a frontside sheet. In this case, the grid applied to the backside sheet will generally be configured to interconnect PV cells but not to collect incident radiation. Regardless, applying an interconnection grid or pattern to a backside laminate sheet, curing the pattern at least partially at low temperature, and then laminating the grid to PV material may avoid the disadvantages associated with applying an interconnection grid directly to the PV material and then curing the grid at conventional high temperatures.

In addition, grid layering and/or surface modification, as described above, may be used in conjunction with any of the other teachings of this disclosure. Furthermore, conductive grid materials suitable for use in conjunction with the present teachings may contain not only silver or silver flakes as described above. Other metals or combinations of metals can be used in formulating a conductive paste in order to lower cost and/or improve performance, including but not limited to copper, gold, tin, carbon, nickel, and various metallic alloys. These conductive elements may take the form of flakes, particles, or nanoparticles, among others, and in some cases a combination of various conductive elements may be used.

What is claimed is:

1. A method of providing a conductive collection grid to a photovoltaic cell, comprising:
    applying a first conductive material to a substantially transparent, non-photovoltaic laminate sheet to form a first grid portion;
    applying a second conductive material to a light gathering surface of a photovoltaic material to form a second grid portion;
    after applying the second conductive material to the photovoltaic material, drying the second conductive material; and
    after drying the second conductive material, laminating the laminate sheet to the light gathering surface of the photovoltaic material.

2. The method of claim 1, wherein after laminating the photovoltaic material and the laminate sheet together, the first grid portion is in electrical contact with the second grid portion.

3. The method of claim 1, further comprising, after the step of drying and before the step of laminating, press-fitting the laminate sheet to the photovoltaic material.

4. The method of claim 1, wherein the first and second grid portions are configured to collect electric current generated when incident solar radiation is transformed into electricity by the photovoltaic cell.

5. The method of claim 1, wherein the laminate sheet is laminated to the photovoltaic cell in a manner configured to allow passage of incident radiation through the laminate sheet to the photovoltaic material.

6. The method of claim 1, wherein drying the second conductive material is performed at a temperature sufficiently low to avoid substantial deformation of the second grid portion.

7. The method of claim 1, further comprising wrapping the laminate sheet in reel to reel fashion, after applying the first grid portion.

8. A method of providing a conductive collection grid to a photovoltaic cell, comprising:
    applying a first conductive material to a substantially transparent, non-photovoltaic laminate sheet to form inter-cell conduction pathways;
    applying a second conductive material to a light gathering surface of a photovoltaic material to form intra-cell conductors;
    drying the second conductive material;
    after the step of drying, press-fitting the laminate sheet to the light gathering surface of the photovoltaic material; and
    after the step of press-fitting, bonding the laminate sheet securely to the photovoltaic material.

9. The method of claim 8, wherein the inter-cell conduction pathways are in electrical contact with the intra-cell conductors after the step of bonding.

10. The method of claim 8, wherein the inter-cell conduction pathways are in electrical contact with the intra-cell conductors after the step of press-fitting.

11. The method of claim 8, wherein the first conductive material is a silver one-part thermoplastic ink applied to the laminate sheet by screen printing.

12. The method of claim 8, wherein the first conductive material is a silver nanoparticle ink applied to the laminate sheet by ink jet printing.

13. The method of claim 8, further comprising scraping the inter-cell conduction pathways before the step of press-fitting.

14. The method of claim 13, wherein scraping is accomplished by wrapping the laminate at high tension.

15. A method of providing a conductive collection grid to a photovoltaic cell, comprising:
    applying inter-cell conduction pathways to a substantially transparent, non-conductive laminate sheet;
    applying intra-cell conductors to a light gathering surface of a photovoltaic material;
    drying the intra-cell conductors on the photovoltaic material;
    after drying the intra-cell conductors, press-fitting the laminate sheet to the light gathering surface of the photovoltaic material; and
    after press-fitting the laminate sheet to the photovoltaic material, bonding the photovoltaic material and the laminate sheet securely together.

16. The method of claim 15, wherein a fully connected conductive grid is formed during the step of press-fitting.

17. The method of claim 15, wherein a fully connected conductive grid is formed during the step of bonding.

18. The method of claim 15, wherein the step of bonding includes laminating the laminate sheet to the photovoltaic material.

19. The method of claim 15, further comprising scraping the inter-cell connections prior to the step of press-fitting.

20. The method of claim 19, wherein scraping is accomplished by wrapping the laminate sheet with the inter-cell connections applied in reel to reel fashion.

* * * * *